(12) United States Patent
Yang

(10) Patent No.: US 12,189,959 B2
(45) Date of Patent: Jan. 7, 2025

(54) MEMORY DEVICE WITH COMPRESSED SOFT INFORMATION AND ASSOCIATED CONTROL METHOD

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 8 days.

(21) Appl. No.: 18/129,028

(22) Filed: Mar. 30, 2023

(65) Prior Publication Data

US 2024/0329845 A1 Oct. 3, 2024

(51) Int. Cl.
| | |
|---|---|
| *G06F 3/06* | (2006.01) |
| *H03M 13/45* | (2006.01) |
| *G11C 29/52* | (2006.01) |
| *H03M 13/00* | (2006.01) |
| *H03M 13/11* | (2006.01) |

(52) U.S. Cl.
CPC .......... *G06F 3/0613* (2013.01); *G06F 3/0659* (2013.01); *G06F 3/0679* (2013.01); *H03M 13/45* (2013.01); *G06F 2212/401* (2013.01); *G11C 29/52* (2013.01); *H03M 13/1108* (2013.01); *H03M 13/1111* (2013.01); *H03M 13/6312* (2013.01)

(58) Field of Classification Search
CPC . G11C 29/52; G06F 3/0679; G06F 2212/401; G06F 3/0613; G06F 3/0659; H03M 13/1111; H03M 13/1108; H03M 13/6312; H03M 13/45
See application file for complete search history.

(56) References Cited

U.S. PATENT DOCUMENTS

| | | | |
|---|---|---|---|
| 2022/0374308 A1* | 11/2022 | Tishbi | H03M 13/1111 |
| 2023/0170004 A1* | 6/2023 | Azuma | G11C 7/06 |
| | | | 365/189.011 |
| 2023/0308114 A1* | 9/2023 | Kaynak | H03M 13/611 |

* cited by examiner

*Primary Examiner* — April Y Blair
*Assistant Examiner* — Sazzad Hossain
(74) *Attorney, Agent, or Firm* — Winston Hsu

(57) ABSTRACT

The present invention provides a control method of the memory device. In the operation of the memory device, the soft information is compressed by a control circuit within the flash memory module, so that the second readout information including the compressed soft information transmitted by the flash memory module has much smaller data size. Therefore, the performance of the memory interface will not be affected due to the bandwidth occupied by the soft information transmission.

7 Claims, 10 Drawing Sheets

MEMORY DEVICE WITH COMPRESSED SOFT INFORMATION AND ASSOCIATED CONTROL METHOD

BACKGROUND OF THE INVENTION

1. Field of the Invention

The present invention relates to access control of flash memory, and more particularly, to a method for performing access management of a flash memory module and associated flash memory controller and electronic device.

2. Description of the Prior Art

Developments in memory technology have led to the wide application of portable or non-portable memory devices, such as memory cards which conform to the SD/MMC, CF, MS and XD specifications, respectively, solid state drives (SSDs), or embedded memory devices which conform to the Universal Flash Storage (UFS) and embedded Multi Media Card (eMMC) specifications, respectively. Improving access control of memories in these memory devices remains an issue to be solved in the art.

NAND flash memories may comprise single level cell (SLC) and multiple level cell (MLC) flash memories. In an SLC flash memory, each transistor used as a memory cell may have any of two electrical charge values, respectively representing the logic values 0 and 1. The storage ability of each transistor used as a memory cell in an MLC flash memory may be fully utilized, where the transistor may be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

Compared with the SLC flash memory, the lower cost and larger capacity of the MLC flash memory means it is more likely to be applied in memory devices. The MLC flash memory does have instability issues, however. To ensure that access control of the flash memory in the memory device meets related specifications, a controller of the flash memory is usually configured to have management mechanisms to properly manage the access of data.

Related art memory devices with the above management mechanisms still have some disadvantages. For example, as the triple level cell (TLC) flash memories and quad-level cell (QLC) flash memories have been applied to the memory devices, there are some problems such as an increased bit error rate, etc. To successfully decode data with higher bit error rate, a low-density parity-check code (LDPC) decoding method can be used. However, the LDPC decoding method needs a sign bit and at least one soft bit to decode the data, that is the data transfer of the flash memory interface will be greatly increased, thus affecting the performance of the flash memory.

SUMMARY OF THE INVENTION

It is an objective of the present invention to provide a control method of a memory device, which can efficiently obtain enough information for the decoding operations with lower data transfer, to solve the above-mentioned problems.

According to one embodiment of the present invention, a control method of a flash memory controller is disclosed, wherein the flash memory controller is configured to access a flash memory module, the flash memory module comprises at least one flash memory chip, each flash memory chip comprises a plurality of blocks, each block comprises a plurality of pages. The control method comprises: sending a first read command to the flash memory module, wherein the first read command requests data of a page of the flash memory module; receiving first readout information from the flash memory module in response to the first read command; decoding the first readout information; in response to a condition that the first readout information fails to be decoded, sending a second read command to the flash memory module, wherein the second read command requests soft information of the page of the flash memory module, and the second read command comprises a compression mode indicator; receiving second readout information from the flash memory module in response to the second read command, wherein the second readout information comprises a compressed soft information; decompressed the compressed soft information to generate soft information; and performing a soft decoding method to decode the first readout information by using the soft information.

According to one embodiment of the present invention, a control method of a flash memory module is disclosed, wherein the flash memory module comprises at least one flash memory chip, each flash memory chip comprises a plurality of blocks, each block comprises a plurality of pages. The control method comprises: receiving a read command from a flash memory controller, wherein the read command requests data of a page of the flash memory module; reading a plurality of cells to generate soft information comprising a plurality of soft bits, wherein each of the soft bits is a strong bit or a weak bit; compressing the soft information to generate compressed soft information, wherein the compressed soft information comprises weak bit locations of the plurality of soft bits; and sending second readout information comprising the compressed soft information to the flash memory controller.

According to one embodiment of the present invention, a memory device comprising a flash memory module and a flash memory controller is disclosed.

The flash memory module comprises at least one flash memory chip, each flash memory chip comprises a plurality of blocks, each block comprises a plurality of pages. The flash memory controller is configured to access the flash memory module. In the operation of the memory device, the flash memory controller sends a read command to the flash memory module, and the read command requests data of a page of the flash memory module; after receiving the read command from the flash memory controller, the flash memory module reads a plurality of cells to generate soft information comprising a plurality of soft bits, wherein each of the soft bits is a strong bit or a weak bit; the flash memory module compresses the soft information to generate compressed soft information, wherein the compressed soft information comprises weak bit locations of the plurality of soft bits; and the flash memory module sends second readout information comprising the compressed soft information to the flash memory controller.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
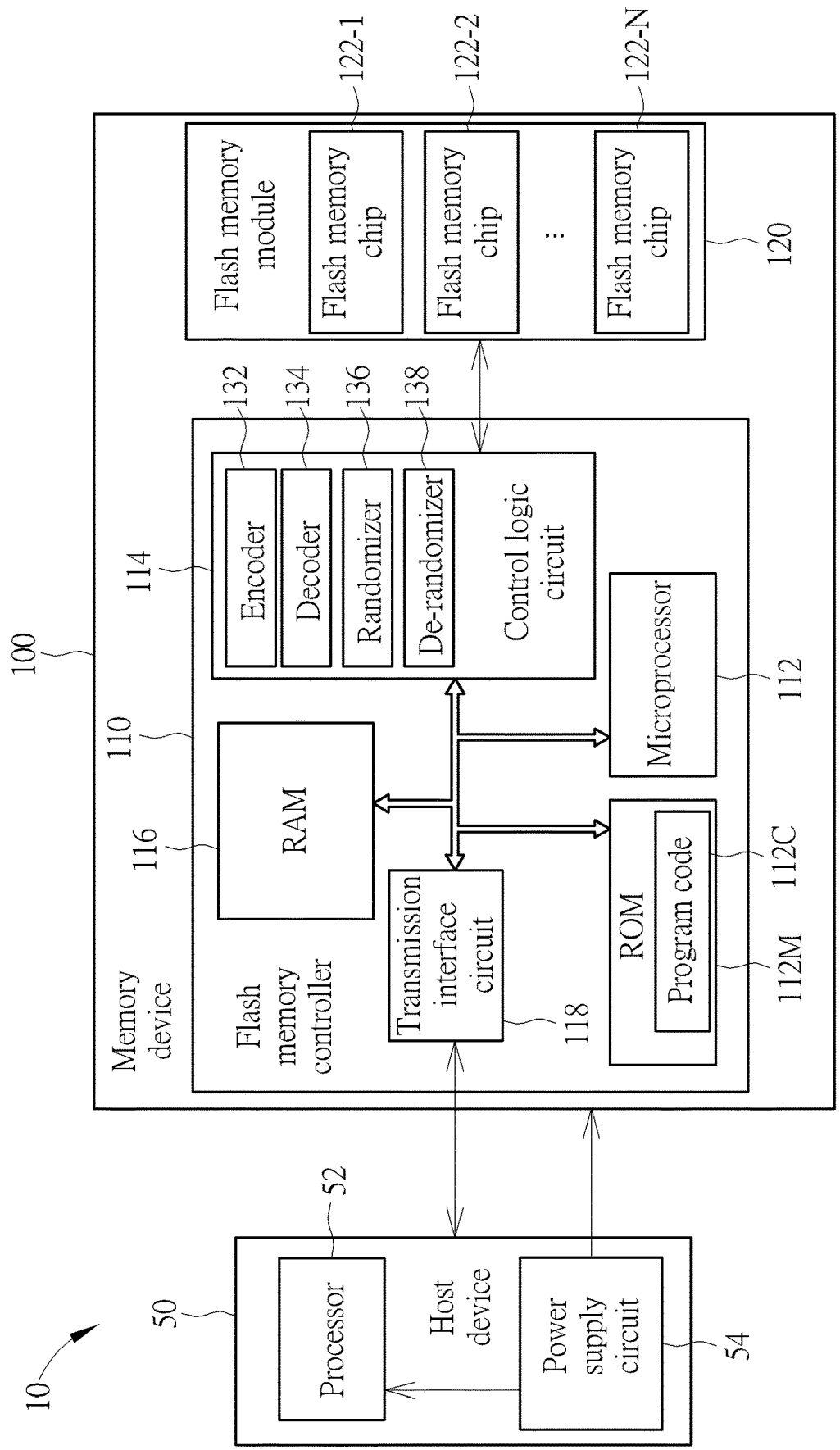
FIG. 1 is a diagram of an electronic device according to an embodiment of the present invention.

FIG. 1 is a diagram of an electronic device 10 according to an embodiment of the present invention, where the electronic device 10 may comprise a host device 50 and a memory device 100. The host device 50 may comprise at least one processor (e.g. one or more processors) which may be collectively referred to as the processor 52, and may further comprise a power supply circuit 54 coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and various types of embedded memory devices such as that conforming to Peripheral Component Interconnect Express (PCIe) specification, etc. According to this embodiment, the memory device 100 may comprise a flash memory controller 110, and may further comprise a flash memory module 120, where the flash controller 110 is arranged to control operations of the memory device 100 and access the flash memory module 120, and the flash memory module 120 is arranged to store information. The flash memory module 120 may comprise at least one flash memory chip such as a plurality of flash memory chips 122-1, 122-2, . . . , and 122-N, where "N" may represent a positive integer that is greater than one.

As shown in FIG. 1, the flash memory controller 110 may comprise a processing circuit such as a microprocessor 112, a storage unit such as a read-only memory (ROM) 112M, a control logic circuit 114, a RAM 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the flash memory 120. Note that, in some examples, the program code 112C may be stored in the RAM 116 or any type of memory. Further, the control logic circuit 114 may be arranged to control the flash memory 120, and may comprise an encoder 132, a decoder 134, a randomizer 136, a de-randomizer 138 and other circuits. The transmission interface circuit 118 may conform to a specific communications specification (e.g. Serial Advanced Technology Attachment (Serial ATA, or SATA) specification, Peripheral Component Interconnect (PCI) specification, Peripheral Component Interconnect Express (PCIe) specification, UFS specification, etc.), and may perform communications according to the specific communications specification, for example, perform communications with the host device 50 for the memory device 100, where the host device 50 may comprise the corresponding transmission interface circuit conforming to the specific communications specification, for performing communications with the memory device 100 for the host device 50.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the flash memory module 120 with the operating commands to perform reading, writing/programing, etc. on memory units (e.g. pages) having physical addresses within the flash memory module 120, where the physical addresses correspond to the logical addresses. When the flash memory controller 110 perform an erase operation on any flash memory chip 122-$n$ of the plurality of NV memory elements 122-1, 122-2, . . . , and 122-N (in which "n" may represent any integer in the interval [1, N]), at least one block of multiple blocks of the flash memory chip 122-$n$ may be erased, where each block of the blocks may comprise multiple pages (e.g. data pages), and an access operation (e.g. reading or writing) may be performed on one or more pages.

Figure 2:
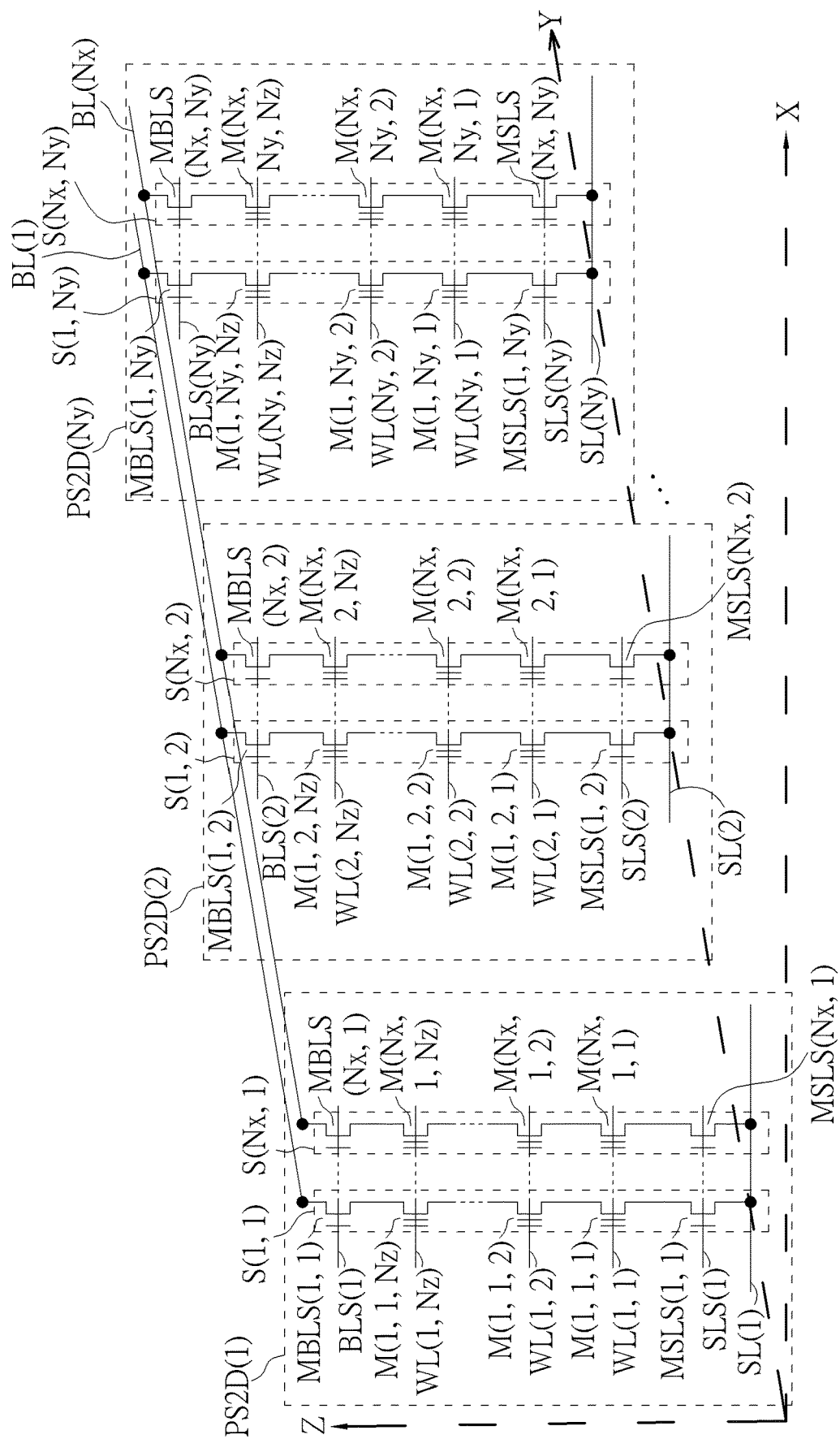
FIG. 2 is a diagram of a three-dimensional (3D) NAND flash memory according to an embodiment of the present invention.

FIG. 2 is a diagram of a three-dimensional (3D) NAND flash memory according to an embodiment of the present invention. For example, any memory element within the aforementioned at least one of the flash memory chips 122-1, 122-2, . . . , and 122-N, may be implemented based on the 3D NAND flash memory shown in FIG. 2, but the present invention is not limited thereto.

According to this embodiment, the 3D NAND flash memory may comprise a plurality of memory cells arranged in a 3D structure, such as (Nx*Ny*Nz) memory cells {{M(1, 1, 1), . . . , M(Nx, 1, 1)}, {M(1, 2, 1), . . . , M(Nx, 2, 1)}, . . . , {M(1, Ny, 1), . . . , M(Nx, Ny, 1)}, {M(1, 1, 2), . . . , M(Nx, 1, 2)}, {M(1, 2, 2), . . . , M(Nx, 2, 2)}, . . . , {M(1, Ny, 2), . . . , M(Nx, Ny, 2)}, . . . , and {M(1, 1, Nz), . . . , M(Nx, 1, Nz)}, {M(1, 2, Nz), . . . , M(Nx, 2, Nz)}, . . . , {M(1, Ny, Nz), . . . , M(Nx, Ny, Nz)}} that are respectively arranged in Nz layers perpendicular to the Z-axis and aligned in three directions respectively corresponding to the X-axis, the Y-axis, and the Z-axis, and may further comprise a plurality of selector circuits for selection control, such as (Nx*Ny) upper selector circuits {MBLS(1, 1), . . . , MBLS(Nx, 1)}, {MBLS(1, 2), . . . , MBLS(Nx, 2)}, . . . , and {MBLS(1, Ny), . . . , MBLS(Nx, Ny)} that are arranged in an upper layer above the Nz layers and (Nx*Ny) lower selector circuits {MSLS(1, 1), ..., MSLS(Nx, 1)}, {MSLS(1, 2), ..., MSLS(Nx, 2)}, ..., and {MSLS(1, Ny), ..., MSLS(Nx, Ny)} that are arranged in a lower layer below the Nz layers. In addition, the 3D NAND flash memory may comprise a plurality of bit lines and a plurality of word lines for access control, such as Nx bit lines BL(1), ..., and BL(Nx) that are arranged in a top layer above the upper layer and (Ny*Nz) word lines {WL(1, 1), WL(2, 1), ..., WL(Ny, 1)}, {WL(1, 2), WL(2, 2), ..., WL(Ny, 2)}, ..., and {WL(1, Nz), WL(2, Nz), ..., WL(Ny, Nz)} that are respectively arranged in the Nz layers. Additionally, the 3D NAND flash memory may comprise a plurality of selection lines for selection control, such as Ny upper selection lines BLS(1), BLS(2), ..., and BLS(Ny) that are arranged in the upper layer and Ny lower selection lines SLS(1), SLS(2), ..., and SLS(Ny) that are arranged in the lower layer, and may further comprise a plurality of source lines for providing reference levels, such as Ny source lines SL(1), SL(2), ..., and SL(Ny) that are arranged in a bottom layer below the lower layer.

As shown in FIG. 2, the 3D NAND flash memory may be divided into Ny circuit modules PS2D(1), PS2D(2), ..., and PS2D(Ny) distributed along the Y-axis. For better comprehension, the circuit modules PS2D(1), PS2D(2), ..., and PS2D(Ny) may have some electrical characteristics similar to that of a planar NAND flash memory having memory cells arranged in a single layer, and therefore may be regarded as pseudo-2D circuit modules, respectively, but the present invention is not limited thereto. In addition, any circuit module PS2D(ny) of the circuit modules PS2D(1), PS2D(2), ..., and PS2D(Ny) may comprise Nx secondary circuit modules S(1, ny), ..., and S(Nx, ny), where "ny" may represent any integer in the interval [1, Ny]. For example, the circuit module PS2D(1) may comprise Nx secondary circuit modules S(1, 1), ..., and S(Nx, 1), the circuit module PS2D(2) may comprise Nx secondary circuit modules S(1, 2), ..., and S(Nx, 2), ..., and the circuit module PS2D(Ny) may comprise Nx secondary circuit modules S(1, Ny), ..., and S(Nx, Ny). In the circuit module PS2D(ny), any secondary circuit module S(nx, ny) of the secondary circuit modules S(1, ny), ..., and S(Nx, ny) may comprise Nz memory cells M(nx, ny, 1), M(nx, ny, 2), ..., and M(nx, ny, Nz), and may comprise a set of selector circuits corresponding to the memory cells M(nx, ny, 1), M(nx, ny, 2), ..., and M(nx, ny, Nz), such as the upper selector circuit MBLS(nx, ny) and the lower selector circuit MSLS(nx, ny), where "nx" may represent any integer in the interval [1, Nx]. The upper selector circuit MBLS(nx, ny) and the lower selector circuit MSLS(nx, ny) and the memory cells M(nx, ny, 1), M(nx, ny, 2), ..., and M(nx, ny, Nz) may be implemented with transistors. For example, the upper selector circuit MBLS(nx, ny) and the lower selector circuit MSLS(nx, ny) may be implemented with ordinary transistors without any floating gate, and any memory cell M(nx, ny, nz) of the memory cells M(nx, ny, 1), M(nx, ny, 2), ..., and M(nx, ny, Nz) may be implemented with a floating gate transistor, where "nz" may represent any integer in the interval [1, Nz], but the present invention is not limited thereto. Further, the upper selector circuits MBLS(1, ny), ..., and MBLS(Nx, ny) in the circuit module PS2D(ny) may perform selection according to the selection signal on the corresponding selection line BLS(ny), and the lower selector circuits MSLS(1, ny), ..., and MSLS(Nx, ny) in the circuit module PS2D(ny) may perform selection according to the selection signal on the corresponding selection line SLS(ny).

Figure 3:
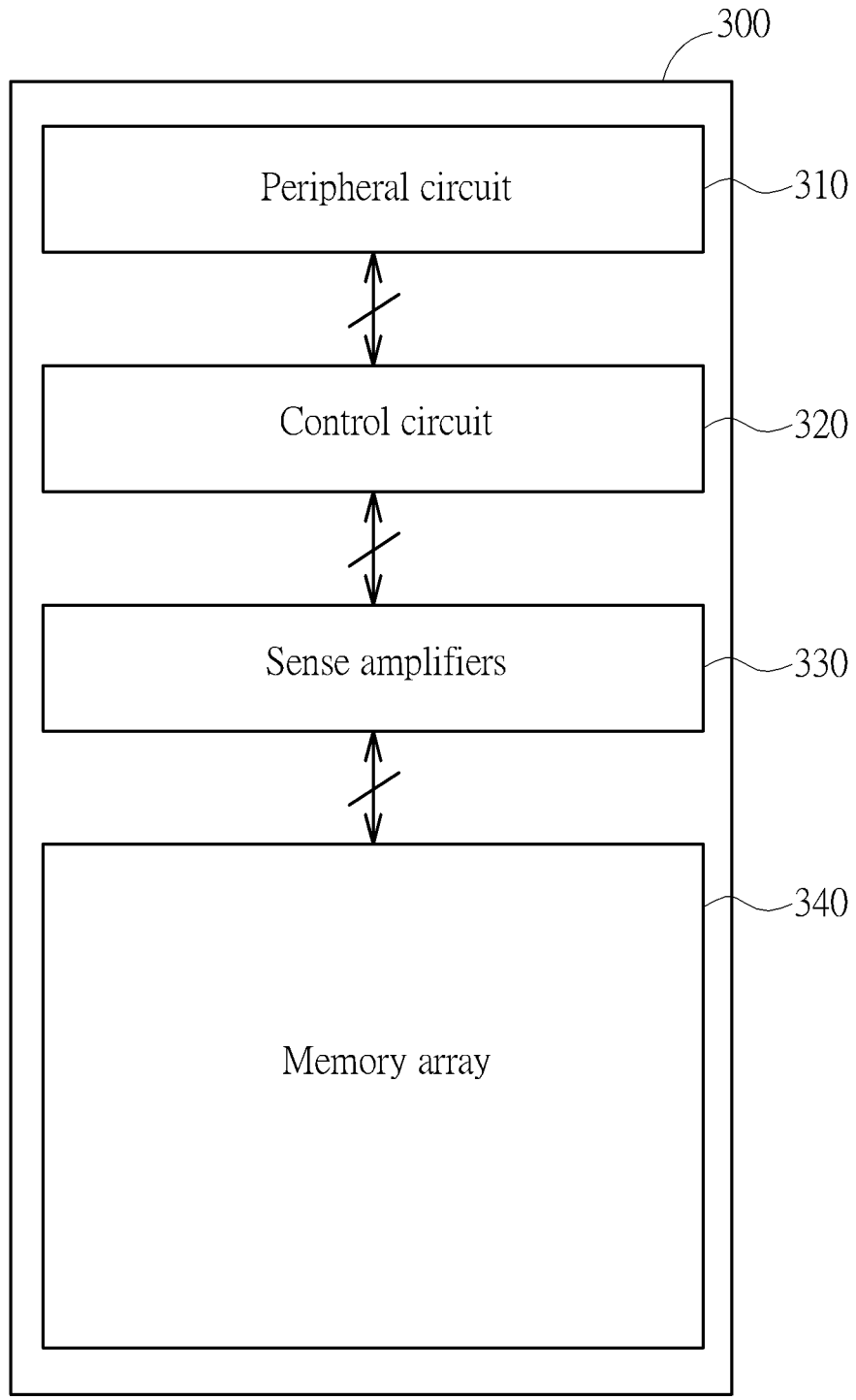
FIG. 3 is a diagram illustrating a flash memory chip according to one embodiment of the present invention.

FIG. 3 is a diagram illustrating a flash memory chip 300 according to one embodiment of the present invention, wherein the flash memory chip 300 can be any one of the flash memory chips 122-1-122-N shown in FIG. 1. As shown in FIG. 3, the flash memory chip 300 comprises a peripheral circuit 310, a control circuit 320, a sense amplifier 330 and a memory array 340, wherein the memory array 340 comprises the memory cells as shown in FIG. 2, the control circuit 320 is configured to control the sense amplifier 330 to read the data from the memory array 340, and the peripheral circuit 310 comprise pads and interface circuits that are connected to the flash memory controller 110.

Figure 4:
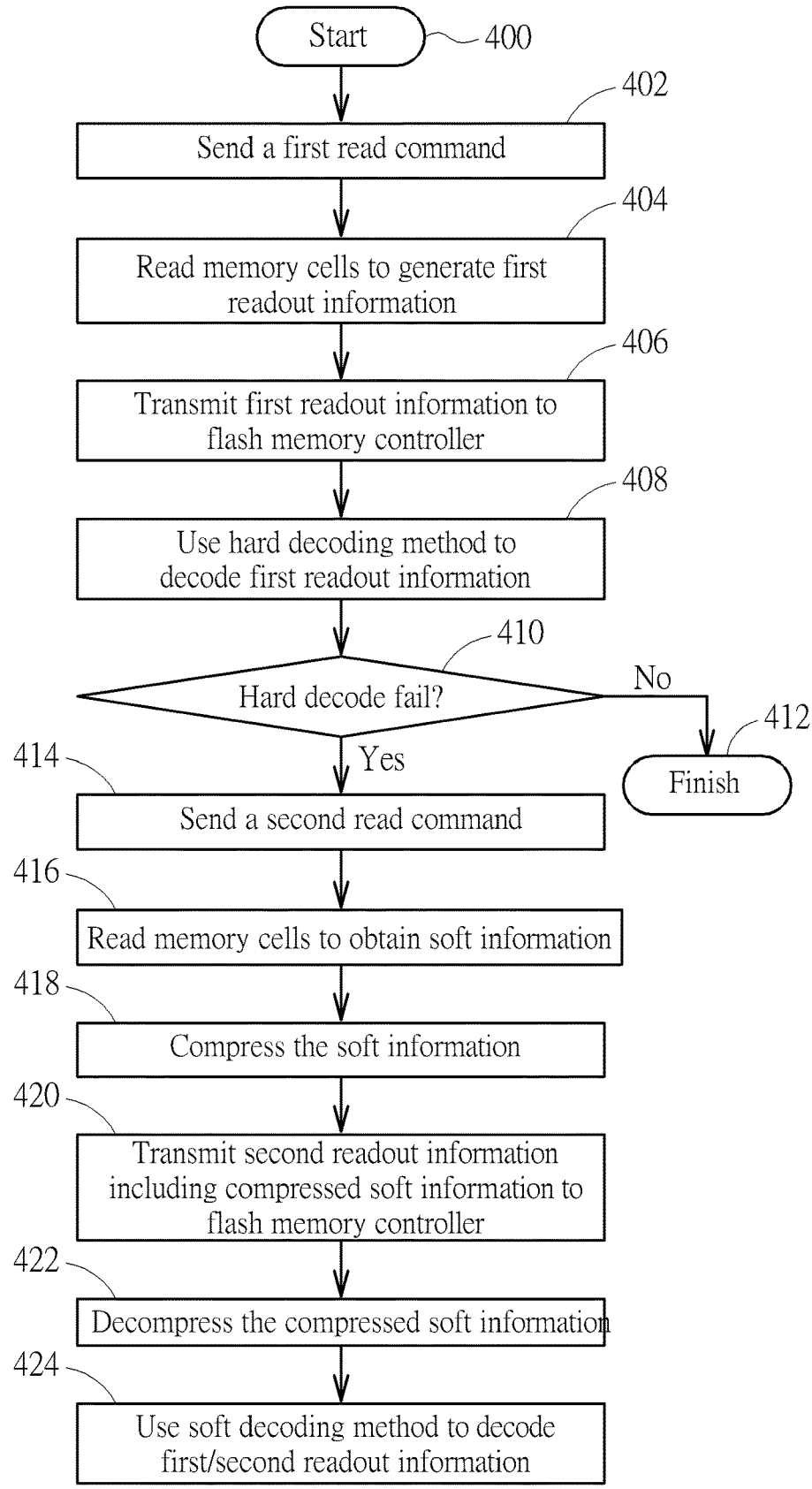
FIG. 4 is a flowchart of a control method of the memory device according to one embodiment of the present invention.
Figure 5:
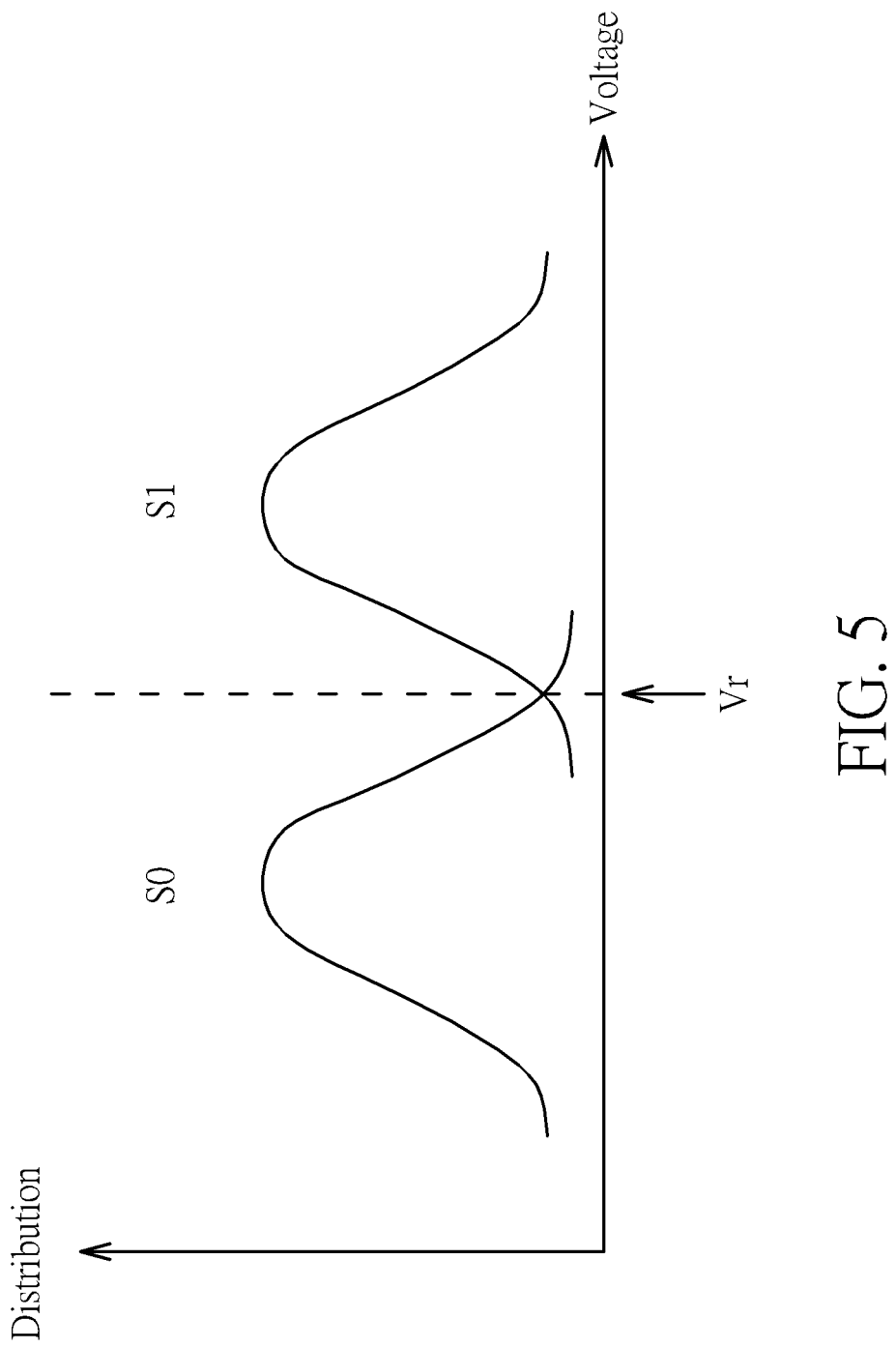
FIG. 5 shows a voltage distribution of a memory cell and a read voltage according to one embodiment of the present invention.

FIG. 4 is a flowchart of a control method of the memory device 100 according to one embodiment of the present invention. In Step 400, the flow starts, and the memory device 100 is powered on. In Step 402, the flash memory device 110 sends a first read command to the flash memory module 120, wherein the first read command requests data in at least one page of a block within the flash memory module 120. In the following description, it is assumed that the first read command requests the data in one page of a SLC block. In Step 404, after receiving the first read command from the flash memory controller 110, the control circuit 320 uses a read voltage to read all of the memory cells corresponding to the page to generate first readout information. FIG. 5 shows a voltage distribution of a memory cell and a read voltage Vr according to one embodiment of the present invention. As shown in FIG. 5, the memory cell is configured to store one bit, and the memory cell has only one of two states S0 and S1, wherein the state S0 corresponds to a logical value "0", and the state S1 corresponds to a logical value "1". The control circuit 320 controls the sense amplifiers 330 to use the read voltage Vr to read each memory cell to determine the logical value of the memory cell, if the memory cell is conductive when the read voltage Vr is applied, the control circuit 320 determines that the memory cell corresponds to the logical value "1"; and if the memory cell is not conductive when the read voltage Vr is applied, the control circuit 320 determines that the memory cell corresponds to the logical value "0". The above logical value of each memory cell determined by the control circuit 320 can be called a sign bit, and the sign bits of all the memory cells corresponding to the page can be called hard information, wherein the first readout information comprises the hard information. It is noted that, because of the voltage distribution of the state S0 and state S1, the sign bit of the memory cell determined by the control circuit 320 may not be the actual logical value.

In Step 406, the flash memory module 120 transmits the first readout information to the flash memory controller 110.

In Step 408, after receiving the first readout information from the flash memory module 120, the de-randomizer 138 de-randomizes the first readout information, and the decoder 134 performs a hard decoding method, such as Bose-Chaudhuri-Hocquenghem (BCH) decoding method or LDPC decoding method, to decode the first readout information (de-randomized first readout information).

In Step 410, if the decoder 134 fail to use the hard decoding method to decode the first readout information, the flow enters Step 414; and if the first readout information is successfully decoded, the flow enters Step 412 to finish this flow.

In Step 414, because the decoder 134 fail to use the hard decoding method to decode the first readout information, it means that a number of error bits in the readout information exceeds a number of error bits that the decoder 134 can correct. Therefore, the flash memory controller 110 sends a second read command to the flash memory module 120, wherein the second read command requests soft information in the same page as the first read command in Step 402.

In this embodiment, the second read command comprises at least a compression mode indicator, a voltage offset value Δ, a physical address of the page.

Figure 6:
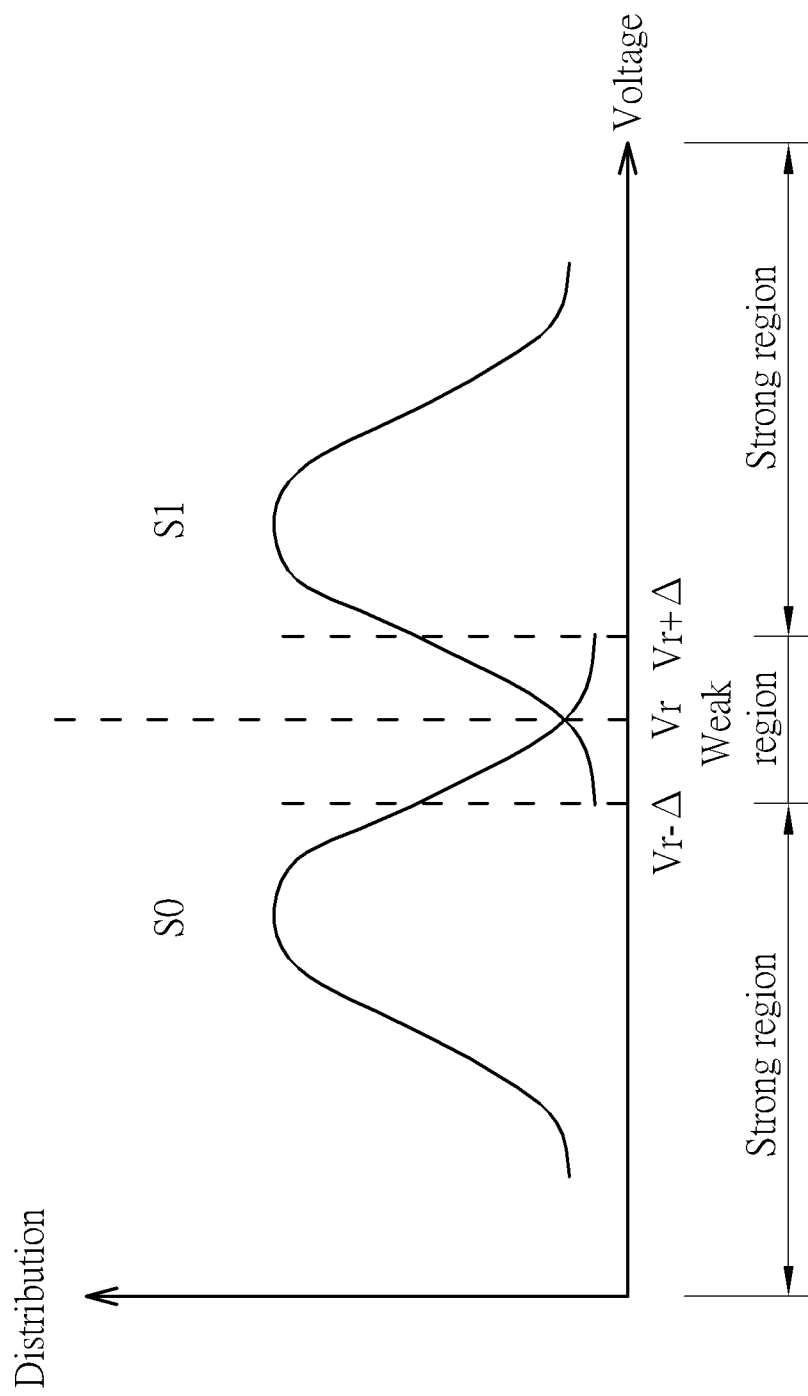
FIG. 6 is a diagram of using two read voltages to obtain a soft bit according to one embodiment of the present invention.

In Step 416, after receiving the second read command from the flash memory controller 110, the control circuit 320 uses two read voltages to read all of the memory cells corresponding to the page to generate soft information, wherein the two read voltages are (Vr+Δ) and (Vr−Δ). FIG. 6 shows using the read voltages (Vr+Δ) and (Vr−Δ) to read the memory cell according to one embodiment of the present invention. As shown in FIG. 6, the control circuit 320 controls the sense amplifiers 330 to use the read voltages (Vr+Δ) and (Vr−Δ) to read each memory cell to determine the soft bit of the memory cell. For example, if the memory cell is conductive when the read voltage (Vr+Δ) is applied, or the memory cell is not conductive when the read voltage (Vr−Δ) is applied, the control circuit 320 determines that the memory cell corresponds to a strong region, and the soft bit of the memory cell is a strong bit "1". If the memory cell is conductive when the read voltage (Vr−Δ) is applied, and the memory cell is not conductive when the read voltage (Vr+Δ) is applied, the control circuit 320 determines that the memory cell corresponds to a weak region, and the soft bit of the memory cell is a soft bit "0". The soft bits of all the memory cells corresponding to the page can be called soft information.

Figure 7:
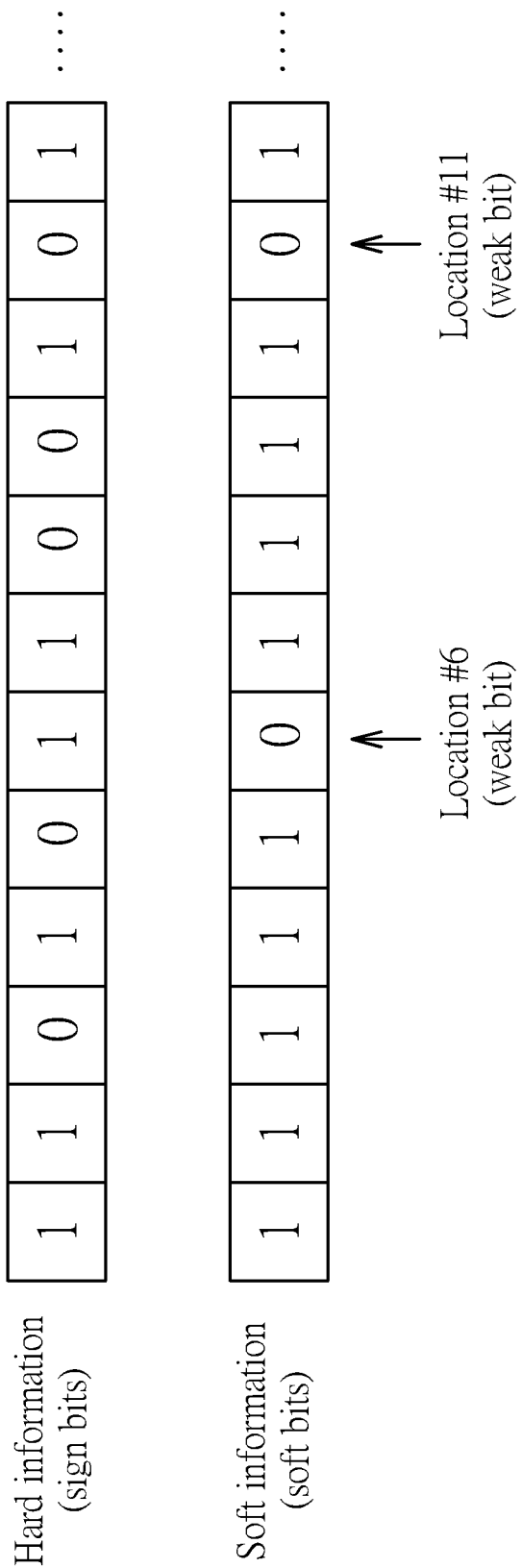
FIG. 7 shows hard information and soft information according to one embodiment of the present invention.
Figure 8:
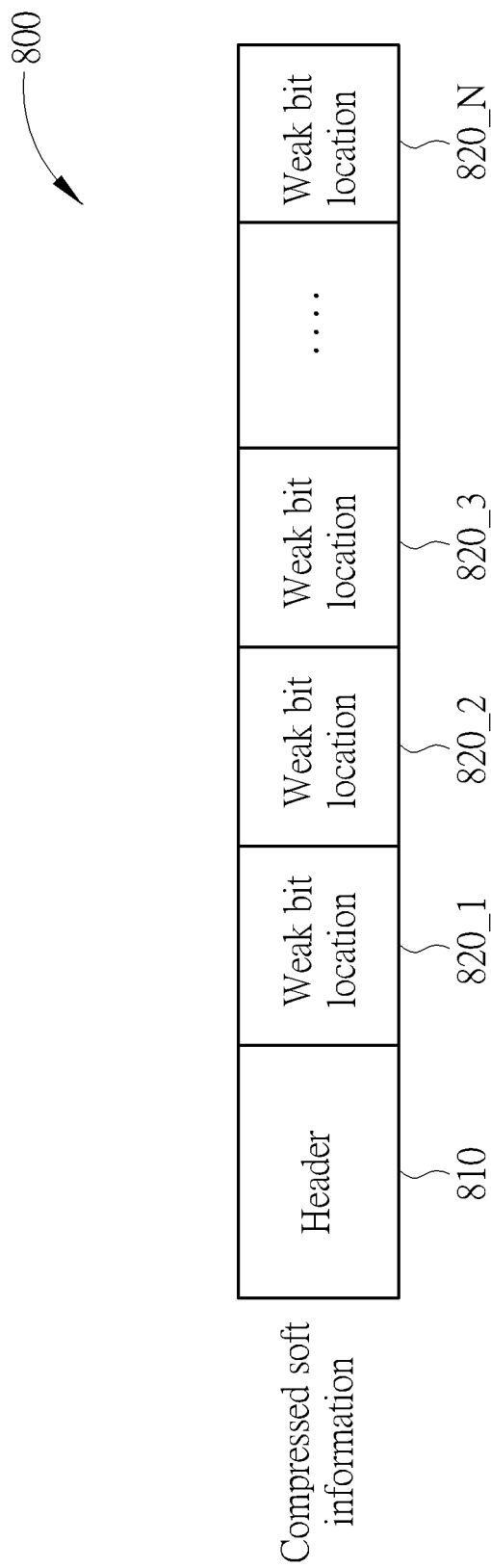
FIG. 8 is a diagram illustrating a compressed soft information according to one embodiment of the present invention.

In this embodiment, most of the soft bits of the pages should be the strong bit "1", for example, assuming that the soft information comprises 32768 soft bits, only a few hundred of them may be "0". Therefore, since most of the soft bits within the soft information are strong bits "1", the control circuit 320 can compress the soft information to lower the size in Step 418, to reduce the burden of subsequent data transmission. Specifically, referring to FIG. 7 and FIG. 8, FIG. 7 shows hard information and soft information according to one embodiment of the present invention, and FIG. 8 shows compressed soft information 800 according to one embodiment of the present invention. As shown in FIG. 7 and FIG. 8, the control circuit 320 can record a weak bit location of the soft bits of the soft information, wherein the weak bit location can be a sequence number of the soft bit whose value is "0", such as the sequence number #6 and sequence number #11 shown in FIG. 7. Then, the control circuit 320 generates the compressed soft information 800 comprising a header 810 and a plurality of fields 820_1-820_N, wherein the header 810 comprises at least a compression mode indicator, a number of weak bits (i.e., the value "N") and the physical address of the page, and each of the fields 820_1-820_N records a weak bit location. For example, the field 820_1 records the sequence number #6, and the field 820_2 records the sequence number #11 shown in FIG. 7.

In the above embodiment, if the soft information comprises 600 weak bits, and each of the field 820_1-820_N uses two bytes to record the weak bit location, the size of the compressed soft information may be a little over 1200 bytes. Therefore, compared with the uncompressed soft information with 32768 bits (4096 bytes), the compressed soft information indeed has lower size.

In Step 420, the flash memory module 120 transmits the second readout information to the flash memory controller 110, wherein the second readout information comprises the compressed soft information.

In Step 422, after receiving the second readout information from the flash memory module 120, an internal circuit of the control logic circuit 114 decompresses the second readout information to regenerate the soft information shown in FIG. 7. In Step 424, the decoder 134 performs a soft decoding method to decode the hard information obtained in Step 408 by using the soft information. For example, the decoder 134 can use a weighted bit-flipping decoding algorithm of the LDPC to decode the hard information by using the soft information. Because the soft decoding method is known by a person skilled in the art, the descriptions of the detailed decoding steps are omitted here.

In light of the above embodiments shown in FIG. 3-FIG. 8, by compressing the soft information, the second readout information transmitted by the flash memory module 120 has much smaller data size, so that the performance of the memory interface will not be affected due to the bandwidth occupied by the soft information transmission.

Figure 9A:
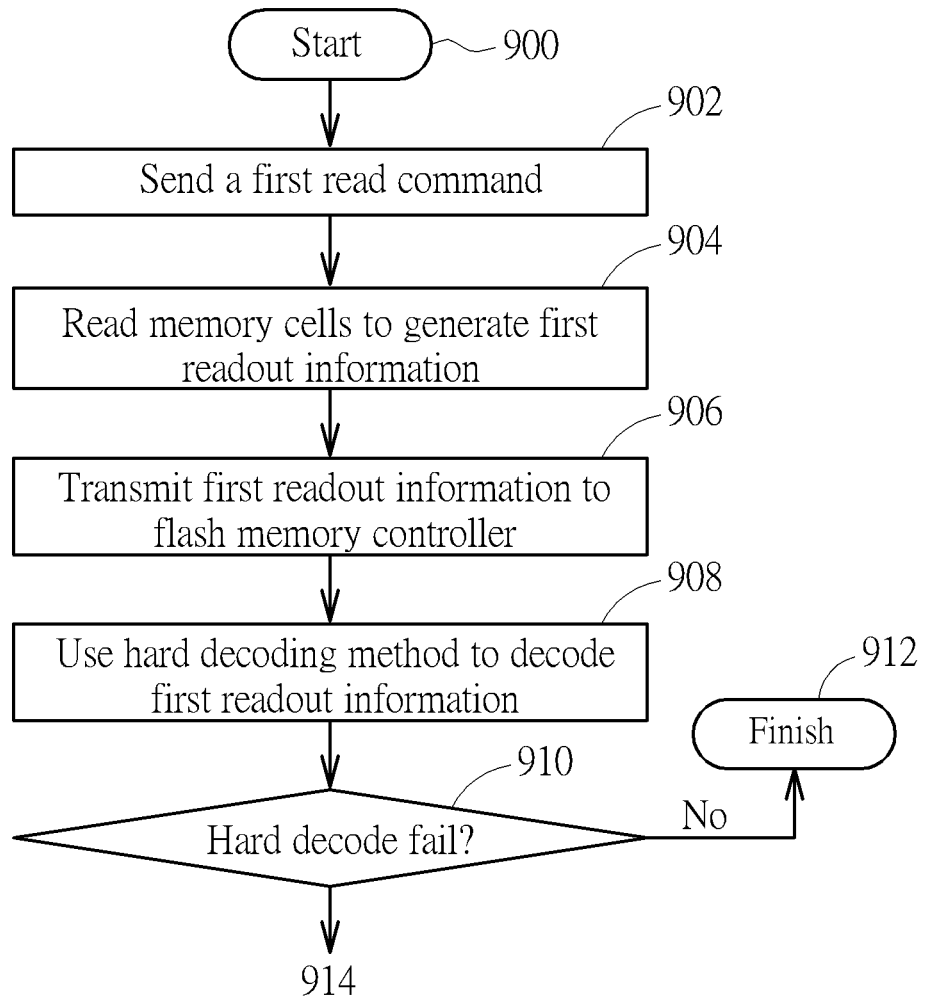
FIG. 9A and FIG. 9B show a flowchart of a control method of the memory device according to one embodiment of the present invention.
Figure 9B:
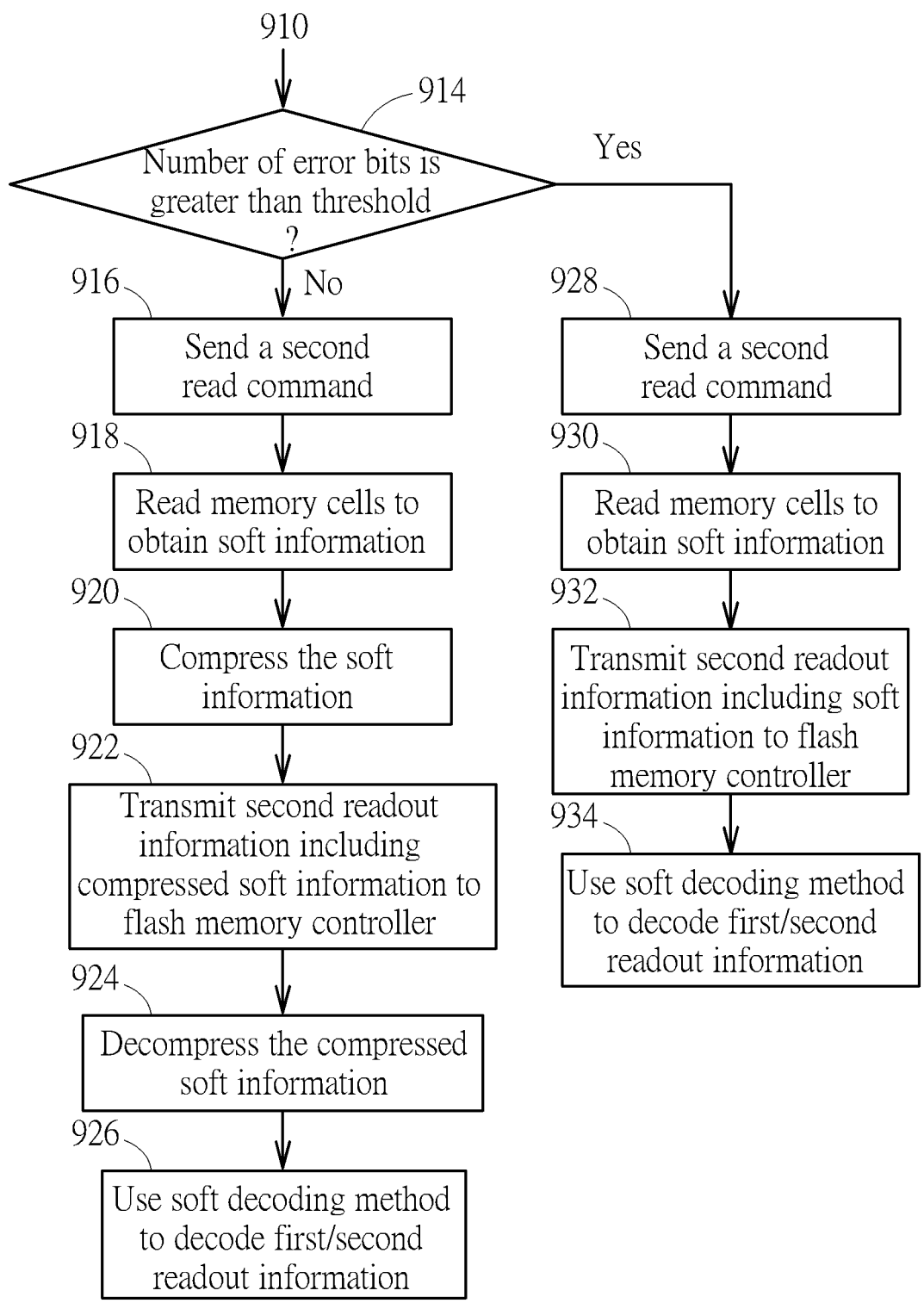

FIG. 9 is a flowchart of a control method of the memory device 100 according to one embodiment of the present invention. In Step 900, the flow starts, and the memory device 100 is powered on. In Step 902, the flash memory device 110 sends a first read command to the flash memory module 120, wherein the first read command requests data in at least one page of a block within the flash memory module 120. In the following description, it is assumed that the first read command requests the data in one page of a SLC block. In Step 904, after receiving the first read command from the flash memory controller 110, the control circuit 320 uses a read voltage to read all of the memory cells corresponding to the page to generate first readout information, as shown in FIG. 5. Similar to the Step 404 shown in FIG. 4, the first readout information comprises hard information including a plurality of sign bits of the page.

In Step 906, the flash memory module 120 transmits the first readout information to the flash memory controller 110.

In Step 908, after receiving the first readout information from the flash memory module 120, the de-randomizer 138 de-randomizes the first readout information, and the decoder 134 performs the hard decoding method to decode the first readout information (de-randomized first readout information).

In Step 910, if the decoder 134 fails to use the hard decoding method to decode the first readout information, the flow enters Step 914; and if the first readout information is successfully decoded, the flow enters Step 912 to finish this flow.

In Step 914, the decoder 134 estimates a number of error bits of the first readout information, and if the estimated number of error bits of the first readout information is greater than a threshold value, the flow enters Step 928; and if the estimated number of error bits of the first readout information is not greater than a threshold value, the flow enters Step 916.

In one embodiment, in the LDPC decoding steps, many syndromes and many syndrome weights are generated, and the decoder 134 can use a distribution of these syndrome weights to estimate the number of error bits of the first readout information. It is noted that the estimation of the number of error bits is known by a person skilled in the art, so the detailed description is omitted here.

In Step 916, the flash memory controller 110 sends a second read command with a compression mode indicator to the flash memory module 120, wherein the second read command requests soft information in the same page as the first read command in Step 902. In addition, the second read command further comprises a voltage offset value Δ and a physical address of the page.

In Step 918, after receiving the second read command from the flash memory controller 110, the control circuit 320 uses two read voltages to read all of the memory cells corresponding to the page to generate soft information, wherein the two read voltages are (Vr+Δ) and (Vr−Δ) shown in FIG. 6. In Step 920, the control circuit 320 compresses the soft information to generate compressed soft information. In Step 922, the flash memory module 120 transmits the second readout information to the flash memory controller 110, wherein the second readout information comprises the compressed soft information. In Step 924, after receiving the second readout information from the flash memory module 120, an internal circuit of the control logic circuit 114 decompresses the second readout information to regenerate the soft information shown in FIG. 7. In Step 926, the decoder 134 performs a soft decoding method to decode the hard information obtained in Step 908 by using the soft information. For example, the decoder 134 can use a weighted bit-flipping decoding algorithm of the LDPC to decode the hard information by using the soft information.

In Step 928, the flash memory controller 110 sends a second read command with a normal mode indicator or a non-compression mode indicator to the flash memory module 120, wherein the second read command requests soft information in the same page as the first read command in Step 902. In addition, the second read command further comprises a voltage offset value Δ and a physical address of the page.

In Step 930, after receiving the second read command from the flash memory controller 110, the control circuit 320 uses two read voltages to read all of the memory cells corresponding to the page to generate soft information, wherein the two read voltages are (Vr+Δ) and (Vr−Δ) shown in FIG. 6. In Step 932, the flash memory module 120 transmits the second readout information to the flash memory controller 110, wherein the second readout information comprises the soft information shown in FIG. 7. In Step 934, the decoder 134 performs a soft decoding method to decode the hard information obtained in Step 908 by using the soft information. For example, the decoder 134 can use a weighted bit-flipping decoding algorithm of the LDPC to decode the hard information by using the soft information.

In the embodiment shown in FIG. 9, in order to avoid that the compressed soft information has larger size close to a size of original soft information, when the number of error bits of the first readout information is greater than the threshold value, the control circuit 320 within the flash memory module 120 does not compress the soft information, and the second readout information comprising the original soft information is transmitted to the flash memory controller 110. That is, only when the number of error bits of the first readout information is lower than the threshold value, the control circuit 320 will compress the soft information to generate the compressed soft information.

Briefly summarized, in the control method of the memory device of the present invention, by compressing the soft information, the second readout information transmitted by the flash memory module has much smaller data size, so that the performance of the memory interface will not be affected due to the bandwidth occupied by the soft information transmission.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method of a flash memory controller, wherein the flash memory controller is configured to access a flash memory module, the flash memory module comprises at least one flash memory chip, each flash memory chip comprises a plurality of blocks, each block comprises a plurality of pages, and the control method comprises:
    sending a first read command to the flash memory module, wherein the first read command requests data of a page of the flash memory module;
    receiving first readout information from the flash memory module in response to the first read command;
    decoding the first readout information;
    in response to a condition that the first readout information fails to be decoded, estimating a number of error bits of the first readout information; sending a second read command to the flash memory module, wherein the second read command requests soft information of the page of the flash memory module, and the second read command comprises a compression mode indicator; wherein if the number of error bits of the first readout information is greater than a threshold value, sending the second read command with the compression mode indicator to the flash memory module; and if the number of error bits of the first readout information is not greater than a threshold value, sending the second read command with a non-compression mode indicator to the flash memory module;
    for the second read command with the non-compression mode indicator to the flash memory module: receiving second readout information from the flash memory module in response to the second read command, wherein the second readout information comprises soft information; and performing a soft decoding method to decode the first readout information by using the soft information;
    for the second read command with the compression mode indicator to the flash memory module:
        receiving the second readout information from the flash memory module in response to the second read command, wherein the second readout information comprises a compressed soft information generated by compressing the soft information;
        decompressing the compressed soft information to generate the soft information; and
        performing the soft decoding method to decode the first readout information by using the soft information.

2. A control method of a flash memory module, wherein the flash memory module comprises at least one flash memory chip, each flash memory chip comprises a plurality of blocks, each block comprises a plurality of pages; wherein when a flash memory controller fails to decode first readout information read from a page of the flash memory module, the flash memory controller estimates a number of error bits of the first readout information, and sends a second read command to the flash memory module, wherein the second read command requests soft information of the page of the flash memory module, and the second read command comprises a compression mode indicator; wherein if the number of error bits of the first readout information is greater than a threshold value, the second read command is sent with the compression mode indicator to the flash memory module; and if the number of error bits of the first readout information is not greater than a threshold value, the second read command is sent with a non-compression mode indicator to the flash memory module; and the control method comprises:

if receiving the read command with the compression mode indicator from the flash memory controller, wherein the read command requests data of the page of the flash memory module:

reading a plurality of cells to generate soft information comprising a plurality of soft bits, wherein each of the soft bits is a strong bit or a weak bit;

compressing the soft information to generate compressed soft information, wherein the compressed soft information comprises weak bit locations of the plurality of soft bits, but the compressed soft information does not comprise strong bit locations of the plurality of soft bits; and sending second readout information comprising the compressed soft information to the flash memory controller, for the flash memory controller to use a soft decoding method to decode the first readout information;

if receiving the read command with the non-compression mode indicator from the flash memory controller: sending the second readout information comprising the soft information to the flash memory controller, for the flash memory controller to use the soft decoding method to decode the first readout information.

3. The control method of claim 2, wherein the step of reading the plurality of cells to generate the soft information comprising the plurality of soft bits comprising:

using a first read voltage and a second read voltage to read the plurality of cells to generate the soft information comprising the plurality of soft bits, wherein the second read voltage is greater than the first read voltage;

wherein for each of the plurality of cells, if the memory cell is conductive when the second read voltage is applied, or the memory cell is not conductive when the first read voltage is applied, the soft bit of the memory cell is the strong bit; and if the memory cell is conductive when the first read voltage is applied, or the memory cell is not conductive when the second read voltage is applied, the soft bit of the memory cell is the weak bit.

4. The control method of claim 2, wherein the soft information further comprises a header, and the head comprises a number of the weak bit locations of the plurality of soft bits.

5. A memory device, comprising:

a flash memory module, wherein the flash memory module comprises at least one flash memory chip, each flash memory chip comprises a plurality of blocks, each block comprises a plurality of pages; and a flash memory controller, configured to access the flash memory module;

wherein when the flash memory controller fails to decode first readout information read from a page of the flash memory module, the flash memory controller estimates a number of error bits of the first readout information, and sends a second read command to the flash memory module, wherein the second read command requests soft information of the page of the flash memory module, and the second read command comprises a compression mode indicator; wherein if the number of error bits of the first readout information is greater than a threshold value, the second read command is sent with the compression mode indicator to the flash memory module; and if the number of error bits of the first readout information is not greater than a threshold value, the second read command is sent with a non-compression mode indicator to the flash memory module;

wherein if the flash memory module receives the second read command with the compression mode indicator from the flash memory controller, the flash memory module reads a plurality of cells to generate soft information comprising a plurality of soft bits, wherein each of the soft bits is a strong bit or a weak bit; the flash memory module compresses the soft information to generate compressed soft information, wherein the compressed soft information comprises weak bit locations of the plurality of soft bits, but the compressed soft information does not comprise strong bit locations of the plurality of soft bits; and the flash memory module sends second readout information comprising the compressed soft information to the flash memory controller;

wherein if the flash memory module receives the second read command with the non-compression mode indicator from the flash memory controller, the flash memory module sends the second readout information comprising the soft information to the flash memory controller;

wherein the flash memory controller receives the second readout information from the flash memory module in response to the second read command, for using a soft decoding method for decode the first readout information.

6. The memory device of claim 5, wherein the flash memory module uses a first read voltage and a second read voltage to read the plurality of cells to generate the soft information comprising the plurality of soft bits, wherein the second read voltage is greater than the first read voltage; and wherein for each of the plurality of cells, if the memory cell is conductive when the second read voltage is applied, or the memory cell is not conductive when the first read voltage is applied, the soft bit of the memory cell is the strong bit; and if the memory cell is conductive when the first read voltage is applied, or the memory cell is not conductive when the second read voltage is applied, the soft bit of the memory cell is the weak bit.

7. The memory device of claim 5, wherein the soft information further comprises a header, and the head comprises a number of the weak bit locations of the plurality of soft bits.

\* \* \* \* \*